US006845433B2

(12) United States Patent
Janzen

(10) Patent No.: US 6,845,433 B2
(45) Date of Patent: *Jan. 18, 2005

(54) MEMORY DEVICE HAVING POSTED WRITE PER COMMAND

(75) Inventor: Jeffrey W. Janzen, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/661,496

(22) Filed: Sep. 15, 2003

(65) Prior Publication Data

US 2004/0080996 A1 Apr. 29, 2004

Related U.S. Application Data

(63) Continuation of application No. 09/641,518, filed on Aug. 21, 2000, now Pat. No. 6,647,470.

(51) Int. Cl.[7] .............................................. G06F 12/00
(52) U.S. Cl. ...................... 711/154; 711/158; 711/159; 711/163; 711/169
(58) Field of Search ................................ 711/167, 133, 711/105, 154, 158, 159, 163, 169

(56) References Cited

U.S. PATENT DOCUMENTS

| 5,388,242 A | 2/1995 | Jewett ......................... 711/113 |
| 5,471,598 A | 11/1995 | Quattromani et al. ........ 711/122 |
| 5,588,125 A | 12/1996 | Bennett ....................... 710/306 |
| 5,673,233 A | 9/1997 | Wright et al. ............... 365/233 |
| 5,881,248 A | 3/1999 | Mergard ...................... 710/106 |
| 5,881,253 A | 3/1999 | Seeman ....................... 710/310 |
| 6,018,484 A | 1/2000 | Brady ......................... 365/201 |
| 6,021,459 A | 2/2000 | Norman et al. ................ 711/5 |
| 6,026,460 A | 2/2000 | David et al. ................ 710/304 |
| 6,094,399 A | 7/2000 | Mick .......................... 365/133 |
| 6,301,627 B1 | 10/2001 | Neal et al. ................... 710/40 |
| 6,427,189 B1 | 7/2002 | Mulla et al. ................ 711/122 |
| 6,434,665 B1 | 8/2002 | Shepherd et al. ........... 711/118 |
| 6,647,470 B1 * | 11/2003 | Janzen ....................... 711/154 |

FOREIGN PATENT DOCUMENTS

EP          0 974 978 A1     1/2000

* cited by examiner

*Primary Examiner*—Nasser Moazzami
*Assistant Examiner*—Brian R. Peugh
(74) *Attorney, Agent, or Firm*—Dickstein Shapiro Morin & Oshinsky LLP

(57) ABSTRACT

A system and method for decreasing the memory access time by determining if data will be written directly to the array or be posted through a data buffer on a per command basis is disclosed. A memory controller determines if data to be written to a memory array, such as a DRAM array, is either written directly to the array or posted through a data buffer on a per command basis. If the controller determines that a write command is going to be followed by another write command, the data associated with the first write command will be written directly into the memory array without posting the data in the buffer. If the controller determines that a write command will be followed by a read command, the data associated with the write command will be posted in the data buffer, allowing the read command to occur with minimal delay, and the posted data will then be written into the array when the internal I/O lines are no longer being used to execute the read command.

12 Claims, 7 Drawing Sheets

MEMORY DEVICE HAVING POSTED WRITE PER COMMAND

This application is a continuation of application Ser. No. 09/641,518, filed Aug. 21, 2000, now U.S. Pat. No. 6,647,470, the subject matter of which is incorporated by reference herein.

BACKGROUND OF THE INVENTION

1. Field of the Invention

The present invention relates generally to memory devices, and more particularly to a memory device that determines if write data should be posted on a per command basis for improving system bus efficiency.

2. Description of the Related Art

An increasing number of electronic equipment and electronic-based systems require some form of high-speed memory devices for storing and retrieving information (or "data"). While the types of such memory devices vary widely, semiconductor memory devices are most commonly used in memory applications requiring implementation in a relatively small area. Within this class of semiconductor memory devices, the DRAM (Dynamic Random Access Memory) is one of the more commonly used types.

Many of the operations performed by the central processing unit (CPU) of these systems are memory accesses on the memory arrays of the system. The term access typically refers to reading data from or writing data to selected memory cells. FIG. 1A illustrates, in block diagram form, a portion of the components for accessing a conventional memory device. Array 10 consists of a plurality of memory cells arranged in rows and columns, into which and from which data can be written and read. Data is provided on the data inputs/outputs DQs 22 from a system bus (not shown) and input data is supplied to the data input registers 20 via bus 26. The input data is latched by the write latch 16, and placed on the bus 24 for input to the I/O gates 12. The I/O gates 12 then write the data via bus 28 to the array 10. Similarly, when data is to be read from the array 10, the data is provided to the I/O gates 12 by bus 28 and input to the read latch 14 via bus 24. The latched data is then driven by drivers 18 and output to a system bus (not shown) on the DQs 22 via bus 26.

There are some shortcomings, however, with the conventional system for accessing memory arrays. For example, conventional access systems typically have slow write to read cycle times, i.e., the time required to perform a data write and then a data read. This is caused by the delay required for the I/O gates 12 to write the data into the array 10 before data can be provided from the array 10 to the I/O gates 12 during the read.

As processor speeds continue to increase, increased memory access speeds are becoming more important. There have been attempts to decrease the write to read cycle time by "posting" the data to be written into the array. Posting refers to placing the data to be written into the array in a data-buffer 30 as shown in FIG. 1B, and delaying the writing of the data to the memory array until the controller determines an available time when the I/O gates are not being used for a read operation, such as for example a subsequent write command. For example, the data in the buffer 30 will be put into the write latch 16 and subsequently into the array 10 through I/O gates 12 when a new write command is issued, and new data (from the new write command) is being input to the buffer 30. However, posting every write data will always delay the write access to the memory array, thereby reducing the system efficiency. Additionally, when a read command follows several write commands, if the data in the buffer 30 is not written into the array 10 before the read command is executed, there is the risk of the data in the buffer 30 becoming corrupted. Accordingly, there will still be a delay between the last write command before a read command can be executed to ensure the data is not corrupted.

Accordingly, it is desirous to increase memory access speed by decreasing the write to read cycle time, without reducing the system efficiency by always delaying write commands.

SUMMARY OF THE INVENTION

The present invention alleviates some of the problems of the prior art and provides a unique system and method for decreasing the memory access time by determining if data will be written directly to the array or be posted through a data buffer on a per command basis, thereby optimizing the system efficiency.

In accordance with the present invention, a memory controller determines if data to be written to a memory array, such as a DRAM array, is either written directly to the array or posted through a data buffer on a per command basis. If the controller determines that a write command is going to be followed by another write command, the data associated with the first write command will be written directly into the memory array without posting the data in the buffer. If the controller determines that a write command will be followed by a read command, the data associated with the write command will be posted in the data buffer, allowing the read command to occur with minimal delay, and the posted data will then be written into the array when the internal I/O lines are no longer being used to execute the read command. By determining whether or not to post the data on a per command basis, the memory controller has greater flexibility for improved data throughput.

These and other advantages and features of the invention will become more readily apparent from the following detailed description of the invention which is provided in connection with the accompanying drawings.

DETAILED DESCRIPTION OF THE PREFERRED EMBODIMENTS

Figure 1A:
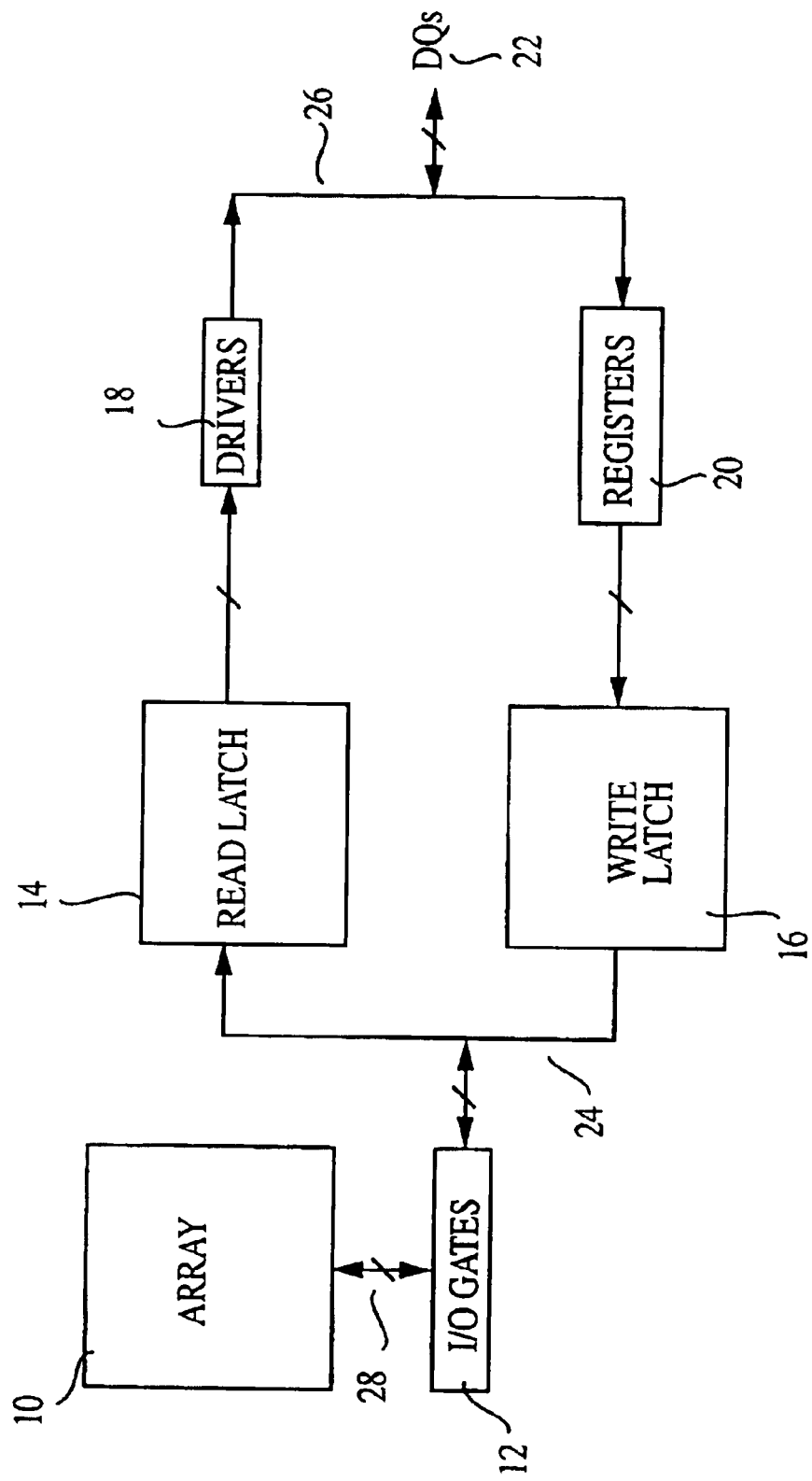
FIG. 1A illustrates in block diagram form a portion of the components for accessing a conventional memory device.

The present invention will be described as set forth in the exemplary embodiments illustrated in FIGS. 2–4. Other embodiments may be utilized and structural or logical changes may be made without departing from the spirit or scope of the present invention. Like items are referred to by like reference numerals.

Figure 1B:
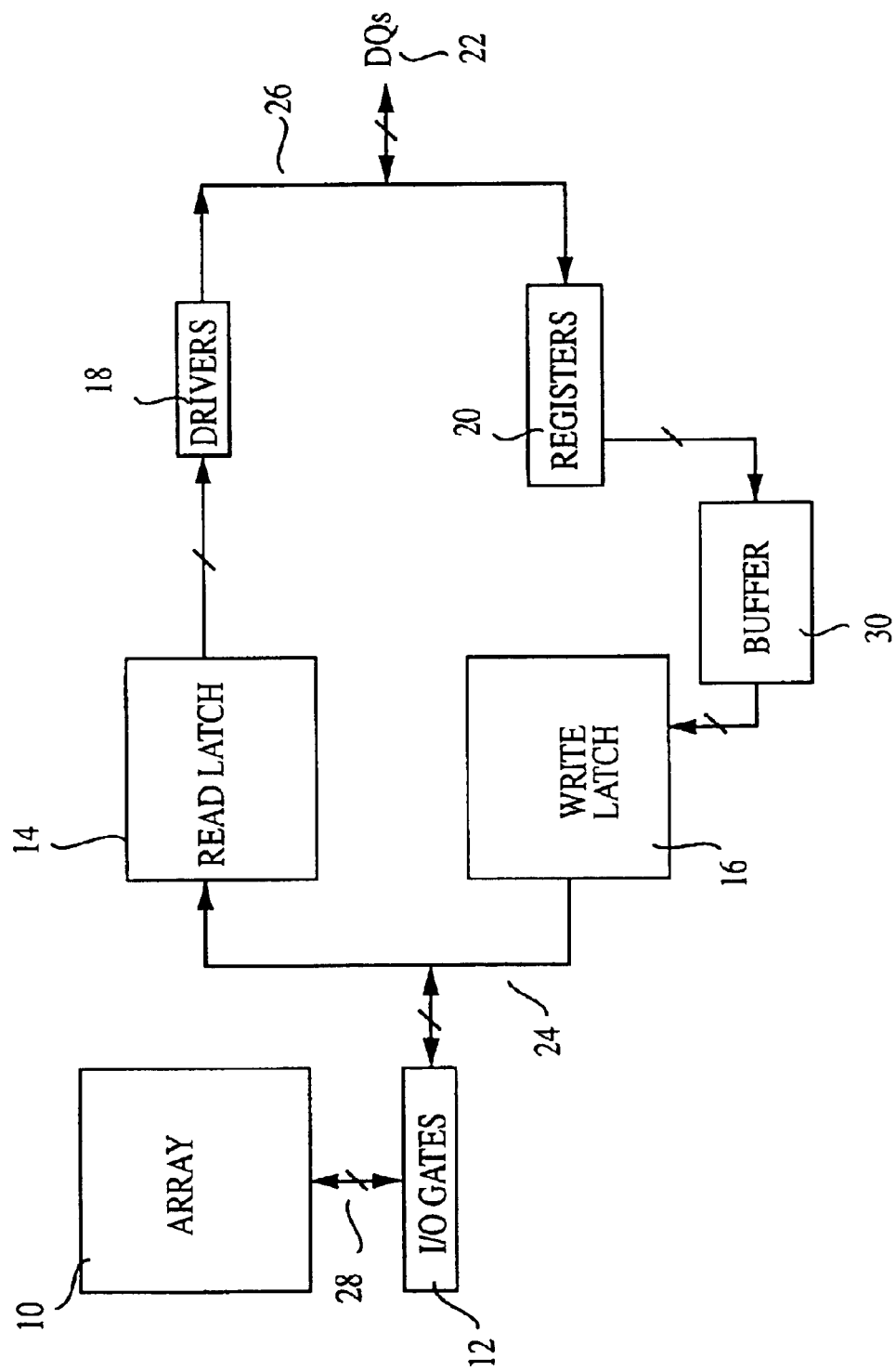
FIG. 1B illustrates in block diagram form a portion of the components for accessing a conventional memory device in which every write command is posted.
Figure 2A:
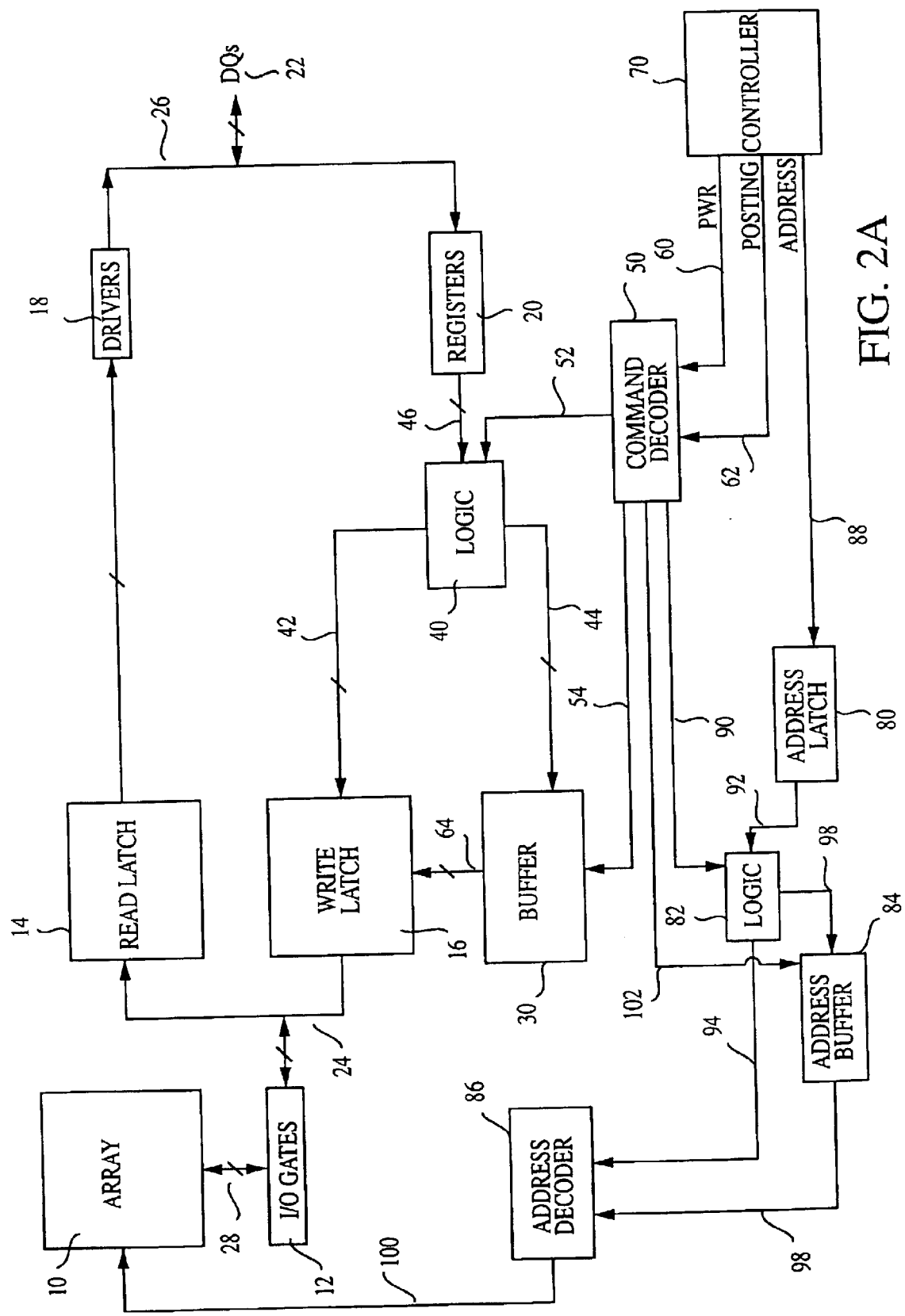
FIG. 2A illustrates in block diagram form a memory device that determines if a write command should be posted on a per command basis in accordance with a first embodiment of the present invention.

In accordance with the present invention, a memory controller determines if data to be written to a memory array, such as a DRAM array, is either written directly to the array or posted through a data buffer on a per command basis. FIG. 2A illustrates in block diagram form a portion of a memory device that determines if a write command should be posted on a per command basis in accordance with the present invention. The elements of FIG. 2A are similar to those of FIG. 1B, except in accordance with the present invention a logic circuit 40 is connected to the registers 20 via bus 46. Logic circuit 40 has a first output connected to the write latch 16 via bus 42, and a second output connected to buffer 30 via bus 44. A second input to logic circuit 40 is connected to a command decoder 50 via signal line 52. Command decoder 50 has a second output connected to buffer 30 via signal line 54. Command decoder 50 is provided with two inputs connected to a memory controller 70 via signal lines 60, 62. The first signal line 60 carries a signal representing whether a write command will be a posted write (pWR) command, as further described below. The second signal line 62 carries a signal representing a posting command, as further described below. Additionally, FIG. 2A illustrates an address latch 80 which receives and latches the address into which data is to be written from controller 70 via line 88. Address latch 80 is connected to logic circuit 82 via line 92. Logic circuit 82 also receives a signal from command decoder 50 via line 90. Logic circuit 82 is connected to address decoder 86 via line 94 and address buffer 84 via line 96. Address buffer 84 is connected to address decoder 86 via line 98, and receives a signal from command decoder 50 via line 102. Address decoder 86 decodes the address received from either logic circuit 82 or address buffer 84 and provides a signal via line 100 to array 10 to activate the column of array 10 associated with the address.

The operation of the memory device illustrated in FIG. 2A in accordance with the present invention is as follows. Suppose, for example, a write command (WR) is received by the controller 70 requesting that data be written to a specified address in the array 10. The data is provided on the data inputs/outputs DQs 22 from a system bus (not shown) and input to the data input registers 20 via bus 26. Additionally, the address is provided from controller 70 to address latch 80 via line 88, where it is latched and provided to logic circuit 82. The controller 70 will also know the command that will follow the write command, such as for example another write command, a read command, or some other command. If the write command is to be followed by another write command, controller 70 will send a signal to command decoder 50 via line 60 indicating that the first write command need not be posted. The command decoder 50, in turn, will send a signal to logic circuit 40 via line 52 and logic circuit 82 via line 90 indicating the incoming data is not going to be posted and can be written directly to the array 10. Accordingly, the address from logic circuit 82 will be sent to address decoder 86 via line 94 for decoding. When the data is provided from registers 20 via bus 46, logic circuit 40 will pass the data to the write latch 16 via bus 42. The data to be input is latched by the write latch 16, and placed on the bus 24 for input to the I/O gates 12. The I/O gates 12 then write the data via bus 28 to the array 10 in the address activated by the address decoder via line 100. Thus, in accordance with the present invention, if a write command will be followed by another write command, the first write command will not be posted, thus improving efficiency of the system.

Now suppose, for example, that the write command (WR) will be followed by a read command (RD). If the write command is to be followed by a read command, controller 70 will send a signal to command decoder 50 via line 60 indicating that the data associated with the write command must be posted. The command decoder 50, in turn, will send a signal to logic circuit 40 via line 52 and logic circuit 82 via line 90, indicating the incoming data is to be posted and therefore the data and address must be temporarily stored in buffer 30 and address buffer 84, respectively. Accordingly, logic circuit 82 will send the address received from address latch 80 to address buffer 84 and when the data is provided from registers 20 via bus 46, logic circuit 40 will pass the data to the buffer 30 via bus 44. The data will then be stored in buffer 30 and the address stored in address buffer 84 until the controller determines the data in the buffer 30 can be sent to the array 10. The data can be sent to the array 10 when the I/O gates 12 will be idle for a sufficient period of time, i.e., when other core operations are not using the I/O gates 12 to the array 10. For example, the data can be written to the array 10 while the data from the read command is being output via drivers 18 on the DQs 22. The controller 70 will send a signal to command decoder 50 via line 62 indicating posting of the data can occur, i.e., be written from the buffer 30 to the array 10. When the command decoder 30 receives the posting signal from controller 70, it will send a signal to buffer 30 via signal line 54 which will prompt the buffer 30 to transfer its data content to the write latch 16 via bus 64. Additionally, command decoder 50 will send a signal to address buffer 84 via line 102 which will prompt the buffer 84 to send the address to address decoder 86 via line 98. The data to be input is latched by the write latch 16, and placed on the bus 24 for input to the I/O gates 12. The I/O gates 12 then write the data via bus 28 to the array 10 in the address activated by the address decoder via line 100. Thus, in accordance with the present invention, when a write command will be followed by a read command, the controller will issue a posted write command, thereby posting the data associated with the write in a buffer. The read command can then occur without waiting for the input data to be transferred to the array, thereby improving the system efficiency. The input data will then be written from the buffer to the array when the I/O gates to the array are available.

Figure 3A:
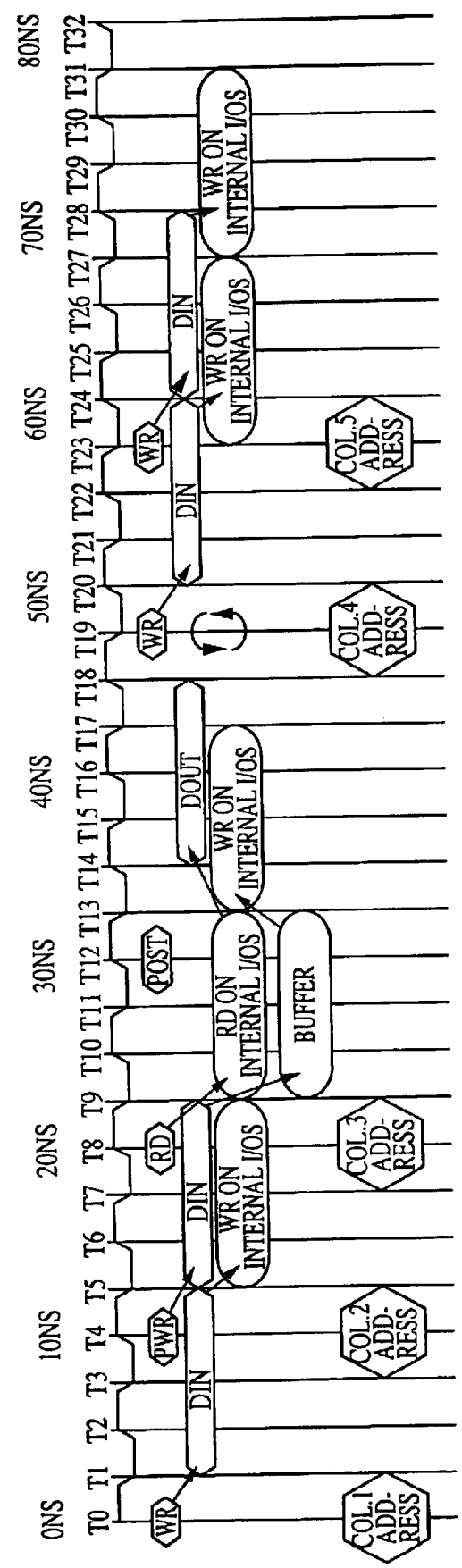
FIG. 3A illustrates a timing diagram of a specific access sequence of the memory device of FIG. 2A.

FIG. 3A illustrates a timing diagram showing the timing of a specific sequence of access commands in which the controller 70 determines if data to be input should be posted on a per command basis in accordance with the present invention. Specifically, FIG. 3A illustrates the following sequence of accesses: Write (WR), Write (WR), Read (RD), Write (WR), and Write (WR) in a memory having a write latency of one clock cycle. As shown in FIG. 3A, at time T0 the first write command is received, as well as the first address Col. 1 Address. As controller 70 will know that the next command at time T4 is to be another write command, the data associated with the first write command will not be posted. As such, the address for the data associated with the first write command will be passed directly to address decoder from logic circuit 82 and the data associated with the first write command, which will be received between time T1 and T5, will be written directly to the decoded address in array 10 utilizing the I/O gates 12 from time T5 to T9 as described above with respect to FIG. 2A. The second write command is received at time T4, along with the second address Col. 2 Address. The second write command is to be followed by a read command at time T8. Accordingly, the second write command will be a posted write command (pWR), and the data associated with the second write command, received from time T5 to T9, will be posted in the buffer 30 and the address for the second write command, i.e., Col. 2 Address, will be sent by logic circuit 82 to address buffer 84 as described above with respect to FIG. 2A. Thus, the data from the read command issued at time T8 from the Col. 3 Address can be output on the I/O gates 12 during time T9 to T13, while data and the address associated with the second write command are buffered in buffer 30 and buffer 84, respectively.

At time T12, the controller 70 will issue a post command to the command decoder 50 via signal line 62, scheduling the data in buffer 30 to be written to the array when the data from the read command is being output from the memory on the DQs 22. Accordingly, the command decoder 50 will send a signal to buffer 30 and address buffer 84. The address stored in buffer 84, i.e., Col. 2 Address, will be sent to decoder 86 via line 98 and the data being input from the second write command will be sent from buffer 30 to the I/O gates 12 via latch 16 from time T13 to T17 and written to the array 10 in the address specified by decoder 86. The data from the read command will be output from time T14 to T18.

At time T19, another write command is issued by the controller 70. As controller 70 knows that the next command at time T23 is to be another write command, the data associated with the write command at time T19 will not be posted. As such, the address Col. 4 Address will be sent directly to address decoder 86 from logic circuit 82 and the data associated with this write command, which will be received between time T20 and T24, will be written directly to the array 10 utilizing the I/O gates 12 from time T23 to T27 as described with respect to FIG. 2A. The next write command, received at time T23, will also not be posted in this example, and as such, the data associated with this write command, which will be received between time T24 and T28, will be written directly to the array 10 in the address specified by decoder 86 utilizing the I/O gates 12 from time T27 to T31.

Thus, in accordance with the present invention, the memory controller determines if data to be written to a memory array, such as a DRAM array, will either written directly to the array or posted through a data buffer on a per command basis, thereby improving the memory system efficiency.

Figure 2B:
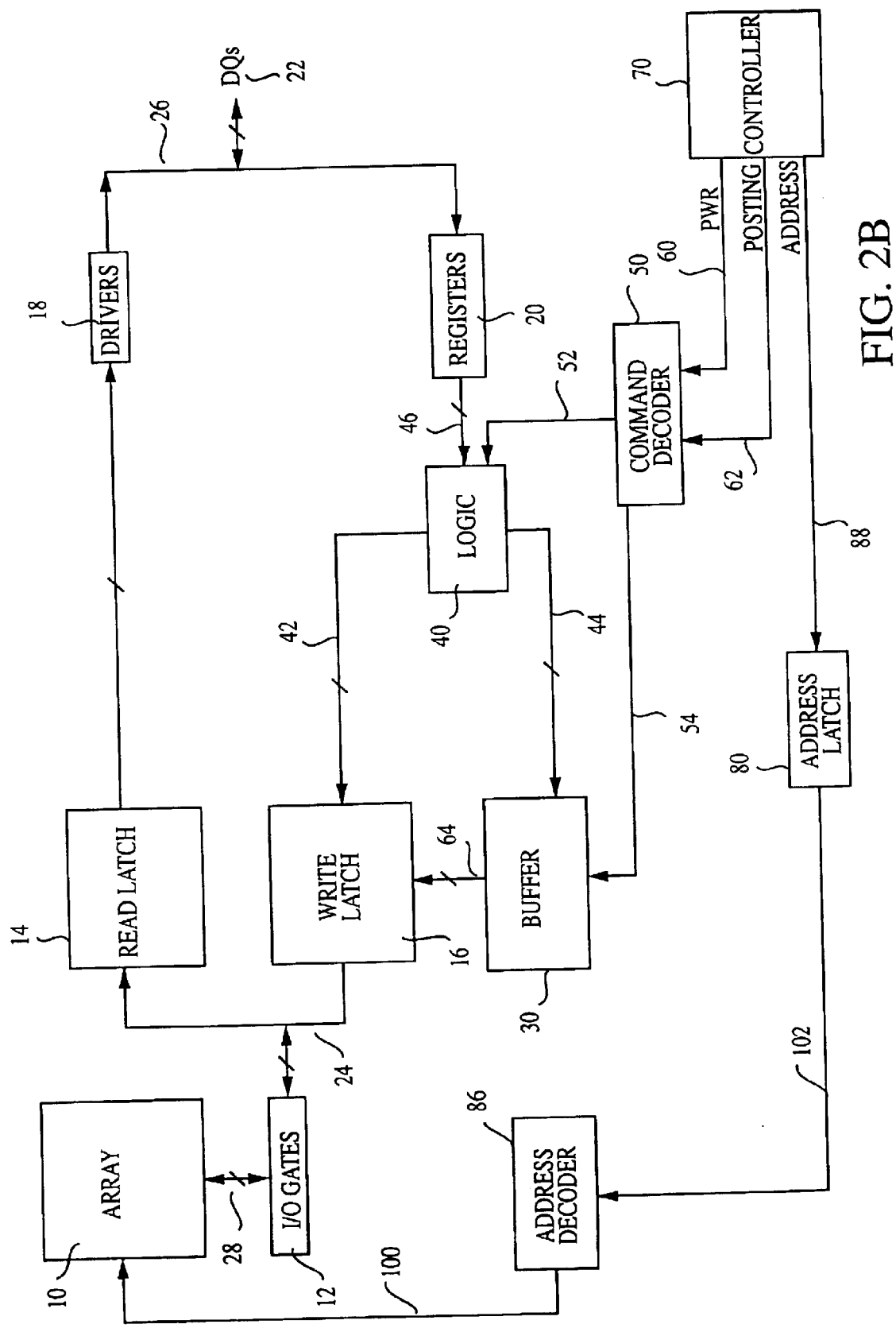
FIG. 2B illustrates in block diagram form a memory device that determines if a write command should be posted on a per command basis in accordance with a second embodiment of the present invention.

FIG. 2B illustrates in block diagram form a portion of a memory device that determines if a write command should be posted on a per command basis in accordance with another embodiment of the present invention. The elements of FIG. 2B are similar to those of FIG. 2A, except in FIG. 2B the address latch 80 is connected directly to address decoder 86 via line 102 and the logic circuit 82 and address buffer 84 are not provided.

Figure 3B:
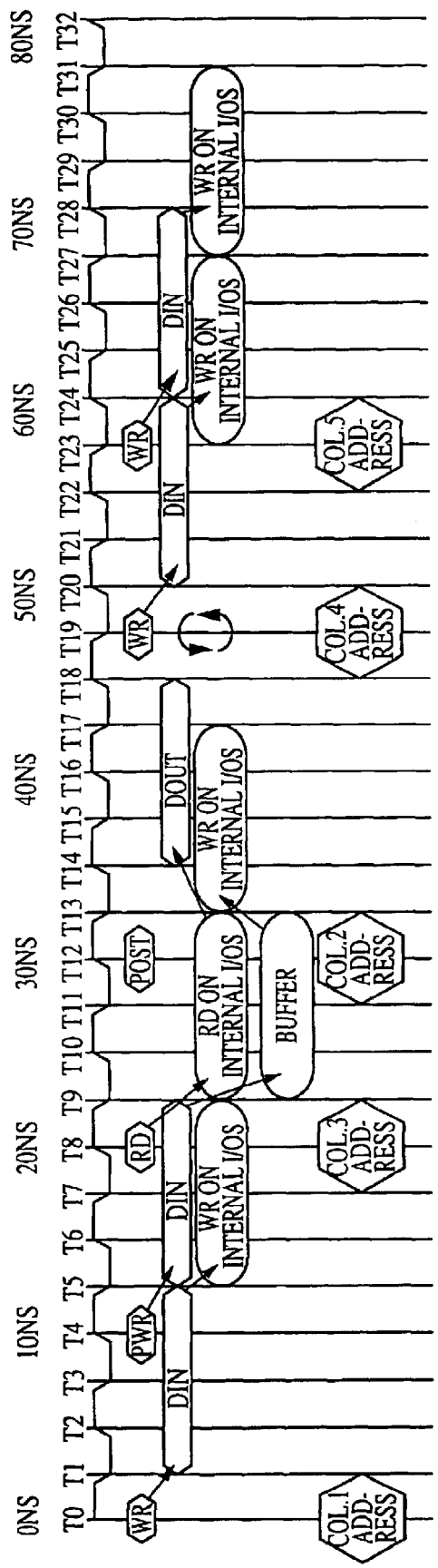
FIG. 3B illustrates a timing diagram of a specific access sequence of the memory device of FIG. 2B.

The operation of the memory device illustrated in FIG. 2B is similar to that as described with respect to FIG. 2A except the address associated with a posted write command will be stored in the controller 70 and not provided to the address latch 80 until the controller 70 provides the post command to command decoder 50 to write the data. For example, as illustrated in FIG. 3B, at time T0 the first write command is received, as well as the first address Col. 1 Address. The address will be sent from controller 70 to address latch 80 and then directly to address decoder 86, and the data writing will be similar to that as described with respect to FIG. 3A. When the second write command, which is a posted write command, is received at time T4, the address Col. 2 Address associated with this write command will be stored in controller 70 and not be sent to the address latch 80. The address Col. 2 Address will not be sent to the address latch 80 until the controller 70 issues the post command to command decoder 50 at time T12. When address latch 80 receives the address Col. 2 Address at time T12, it will send the address to address decoder 86 via line 102, which will decode the address and activate the specified column in array 10. When command decoder 50 receives the post command from controller 70 at time T12, it will send a signal to buffer 30 and the data being input from the second write command will be sent from buffer 30 to the I/O gates 12 via latch 16 from time T13 to T17 and written to the array 10 in the address specified by decoder 86.

As illustrated in FIGS. 3A and 3B, the amount of time required for this sequence of commands to be performed in accordance with the present invention is approximately 77.5 nanoseconds. In a prior art memory device in which every write command is posted, this same sequence would require approximately 100 nanoseconds to complete. Thus, by determining if data should be posted on a per command basis in accordance with the present invention instead of posting every write command as in the prior art, a time savings of approximately 25% can be realized.

Figure 4:
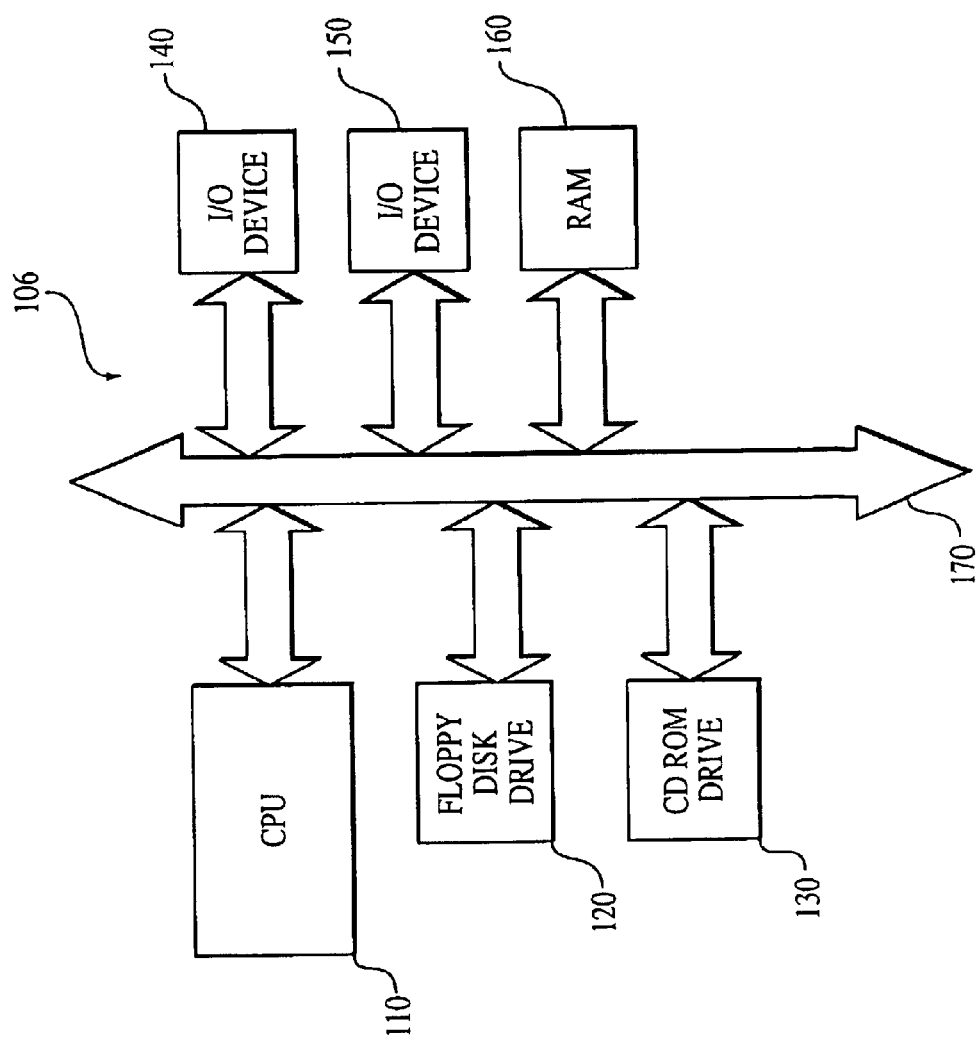
FIG. 4 illustrates in block diagram form a processor system in which the memory device of the present invention may be employed.

A typical processor based system that includes integrated circuits that utilize a posted write on a per command basis according to the present invention is illustrated generally at 106 in FIG. 4. A computer system is exemplary of a system having integrated circuits, such as for example memory circuits. Most conventional computers include memory devices permitting storage of significant amounts of data. The data is accessed during operation of the computers. Other types of dedicated processing systems, e.g., radio systems, television systems, GPS receiver systems, telephones and telephone systems also contain memory devices that can utilize the present invention.

A processor based system, such as a computer system, for example, generally comprises a central processing unit (CPU) 110, for example, a microprocessor, that communicates with one or more input/output (I/O) devices 140, 150 over a bus 170. The computer system 100 also includes random access memory (RAM) 160, and, in the case of a computer system may include peripheral devices such as a floppy disk drive 120 and a compact disk (CD) ROM drive 130 which also communicate with CPU 110 over the bus 170. RAM 160 is preferably constructed as an integrated circuit that includes the circuit for determining posting of a write command on a per command basis as previously described with respect to FIGS. 2A and 2B. It may also be desirable to integrate the processor 110 and memory 160 on a single IC chip. RAM 160 may be a DRAM, SDRAM, DDR, SRAM or any other type of random access memory device.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, die invention is not to be considered as limited by the foregoing description but is only limited by the scope of the appended claims.

What is claimed as new and desired to be protected by Letters Patent of the United States is:

1. A method for writing data to a memory device, comprising:

issuing a write command to the memory device;
issuing input data to the memory device; and
issuing a control signal to the memory device;
wherein
when said control signal is in a first state the memory device is caused to perform a write operation while posting said input data by storing said input data in a temporary storage area, transferring said input data from said temporary storage area to a write latch, and writing said input data from said write latch to an array of said memory device when said array is available for access, and
when said control signal is in a second state the memory device is caused to perform a write operation without posting said input data.

2. The method of claim 1, wherein said control signal is set to said second state if a next command following said write command is another write command.

3. The method of claim 1, wherein if said control signal is set to said first state if a next command following said write command is a read command.

4. A method for writing a input data to a memory device, comprising:
determining a next command following a write command;
if said next command is a read command, causing said memory device to perform a write while posting said input data; and
if said next command is not a read command, causing said memory device to perform a write without posting said input data;
wherein said memory device includes a write latch and a buffer for storing said input data when said input data is posted, and said input data is transferred to a write latch and subsequently written to an array of said memory device when said array is available for writing.

5. The method of claim 4, wherein said causing said memory device to perform a write while posting said input data comprises:
issuing to the memory device, a posted write command.

6. The method of claim 4, wherein said causing said memory device to perform a write while posting said input data comprises:
issuing a write command to the memory device; and
issuing a control signal to the memory device;
wherein said control signal is set to a first state.

7. The method of claim 4, wherein said causing said memory device to perform a write without posting said input data comprises:
issuing to the memory device, a write command.

8. The method of claim 7, wherein said causing said memory device to perform a write without posting said input data further comprises:

issuing a control signal to the memory device;
wherein said control signal is set to a second state.

9. A method for operating a memory device, comprising:
receiving a write command;
receiving an input data associated with said write command;
receiving a control signal associated with said write command;
determining, based on a state of said control signal, whether to process said write command by writing said input data to an array of said memory device, or by posting said input data to a temporary storage area before writing said input data to said array of said memory device;
wherein said writing said input data to said array of said memory device comprises:
transferring said input data to a write latch associated with said array; and
writing said input data from said write latch to said array when said array is available for writing.

10. The method of claim 9, wherein when said input data is posted to the temporary storage area, an address associated with said input data is written to a second temporary storage area and said writing to the array is performed an address of said array corresponding to said address.

11. The method of claim 9, further comprising:
writing input data previously stored in said temporary storage area to said array when a set of input/output gates associated with said array are not being used.

12. A method for operating a memory device, comprising:
receiving a write command and an input data;
determining whether said write command is an ordinary write command or a posted write command;
if said write command is an ordinary write command, processing said write command by immediately writing said input data to an array of said memory device; and
if said write command is a posted write command, processing said write command by writing said input data to a temporary storage area before writing said input data from said temporary storage area to an array of said memory device;
wherein said writing from said temporary storage area to said array comprises:
transferring said input data from said temporary storage area to a write latch associated with said array; and
writing said input data from said write latch to said array when said array is available for writing.

* * * * *